(12) United States Patent
Yoshida

(10) Patent No.: US 7,374,618 B2
(45) Date of Patent: May 20, 2008

(54) GROUP III NITRIDE SEMICONDUCTOR SUBSTRATE

(75) Inventor: Takehiro Yoshida, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 104 days.

(21) Appl. No.: 11/355,985

(22) Filed: Feb. 17, 2006

(65) Prior Publication Data

US 2007/0105258 A1  May 10, 2007

(30) Foreign Application Priority Data

Nov. 9, 2005 (JP) ............................ 2005-325162

(51) Int. Cl.
 *C30B 29/38* (2006.01)
 *H01L 29/06* (2006.01)
(52) U.S. Cl. .................. 117/952; 438/46; 257/618
(58) Field of Classification Search .............. 117/1; 257/1; 438/1; 428/1
See application file for complete search history.

(56) References Cited

U.S. PATENT DOCUMENTS 5,021,862 A * 6/1991 Ogino ..................... 428/66.7
5,751,055 A   5/1998 Maruyama et al.

FOREIGN PATENT DOCUMENTS

JP   7-226349    8/1995
JP   2000-068171   3/2000
JP   2002-356398  * 12/2002

* cited by examiner

*Primary Examiner*—Robert Kunemund
*Assistant Examiner*—Marissa W. Chaet
(74) *Attorney, Agent, or Firm*—Mattingly, Stanger, Malur & Brundidge, P.C.

(57) ABSTRACT

A GaN substrate 1, a group III nitride semiconductor substrate, is provided with an OF portion 2 for the periphery thereof. The bevel 7 on the periphery of the nitric polarity face 5 side of the GaN substrate 1 is provided throughout the entire periphery of the GaN substrate 1 including the OF portion 2, wherein the beveling angle $\theta_2$ of the bevel 7 is given a value in the range over 30° to 60° inclusive.

3 Claims, 4 Drawing Sheets

PRIOR ART

PRIOR ART

GROUP III NITRIDE SEMICONDUCTOR SUBSTRATE

BACKGROUND OF INVENTION

The present invention relates to a group III nitride semiconductor substrate suitable for epitaxial growth processing thereon in preparation of a semiconductor such as a laser diode for emissions ranging from ultraviolet to blue lights or a light emitting diode for short wavelength lights.

A gallium nitride (GaN) substrate in a practical use is known to have typically a shape illustrated in FIGS. 7A to 7D, (refer to Japanese Patent Application Laid-open No. 2002-356398). FIG. 7A is a plan view of such substrate viewed from the group III polarity face side; FIG. 7B is a plan view of the same substrate viewed from the nitric polarity face side; FIG. 7C is an enlarged sectional view of the same substrate viewed on the sectioning-line A-A' in FIG. 7A where the substrate is given a C-beveling; and FIG. 7D is an enlarged sectional view of the same substrate viewed on the sectioning-line A-A' in FIG. 7A where the substrate is given an R-beveling.

According to the description in Japanese Patent Application Laid-open No. 2002-356398 referred in the above, the shape of such substrate is as follows. A circular-shaped GaN substrate 20 is provided with an orientation flat (hereinafter referred to as OF) 22 to indicate the crystal orientation for a designated direction, and is given an index flat (hereinafter referred to as IF) 23 to permit easy discrimination of two sides of a transparent substrate such as the GaN substrate 20. The GaN substrate 20 has a bevel 21 throughout entire periphery thereof except for the OF portion 22 and the IF portion 23. The bevel 21 is formed in either a C-bevel having a beveling angle of θ=5° to 30° or an R-bevel having a rounding radius of 0.1 mm to 0.5 mm. These bevels prevent the GaN substrate 20 from the chipping and the bevel enhances the profile of the GaN substrate 20.

It has been reported that a silicon substrate is required to be beveled. According to a report, the vapor phase epitaxial growth implemented on such a silicon substrate as is given no beveling (a generic for C-bevel and R-bevel hereinafter referred to) will cause a build-up of epitaxial film, called an edge crown, at the periphery of the substrate. (Refer to Japanese Patent Application Laid-open No. 07-226349 for example.)

Further, it is necessary to angle-align a substrate with the required crystal orientation in the building-up a device on a semiconductor substrate by observing the OF portion thereon under a microscope or by detecting the OF portion thereon using an optical sensor. In terms of this, it has been known that there is a semiconductor substrate, wherein its OF portion is exempted from beveling in order to accurately angle-align with an optical manner. (Refer to Japanese Patent Application Laid-open No. 2000-68171 for example.)

SUMMARY OF THE INVENTION

The epitaxial growth on a group III nitride semiconductor substrate is processed using the metal organic vapor phase growth method or other similar practice. This growth is usually conducted with the group III nitride semiconductor substrate being mounted on a susceptor of a carbon substrate having a silicon carbide coating thereon. The susceptor has a round recess (a material receiving concave) of the same size as the material to be received, on which recess the substrate to be processed is mounted.

However, the substrate placed on the recess damages the silicon carbide coating on the susceptor because of a turning movement thereof if the substrate has a conventional shape such that the substrate 20 has, as illustrated in FIG. 7. When the substrate 20 of the conventional shape is put in the processing, a turning movement of the substrate in the recess occurs while growing process is on. This turning movement causes the angular portion in the substrate 20 at the transition between the arc part and the OF portion 22 or the IF portion 23, or on the C-bevel 21 to contact against the silicon carbide coating on the recess of the susceptor with the coating damaged.

It is then newly revealed that this damage on the susceptor, a peeling off of the silicon carbide coating therefrom, invites corrosion of the carbon, the base material of the susceptor, developing into the cause of production of particles that impede the growth by sticking on the face of the substrate when, for example, ammonium is used as the source of nitrogen for the epitaxial growth of the group III nitride semiconductor.

It is also newly found that the widening of the beveling width aiming at the eased handling of substrate leads to worsened plane-uniformity. When the beveling angle θ at the bevel 21 is as small as 5° to 30°, it is necessary to widen the beveling width to permit the substrate 20 to be easily picked up with tweezers. However, the widening of the beveling width on the other hand reduces the contact area of the substrate 20 with the susceptor causing uneven distribution of temperature on the substrate face in heating process therefore developing into worsened on-face-uniformity of the structure of the growing layer.

The Patent publication 2 listed above mentions that an edge crown will appear if a silicon substrate is not given any beveling. The inventor of the present invention has found the same crowning phenomenon also in the vapor phase epitaxial growth on the group III nitride semiconductor substrate; therefore, it is appreciated that the beveling should be applied also to the group III nitride semiconductor substrate. Further, where no beveling is given to a substrate, there is a possibility of occurrence of chipping on the periphery of the substrate. Therefore, it is preferred to give beveling as practicably as possible to the portion that would not disturb the OF portion observation. As an incidental problem thereto, it would be pointed out that, if no beveling is given to the reverse side of the OF portion, picking up the substrate at the OF portion using tweezers becomes impossible resulting in a bad handleability.

The present invention has been made in view of the above problems. The object of the invention includes providing a group III nitride semiconductor substrate which has an ensured evenness in the distribution of temperature on the substrate face in heating process with eased handleability. The object of the present invention further includes providing a group III nitride semiconductor substrate which has a performance that gives less damage on the susceptor in the epitaxial growth processing with reduced fear of occurrences of the edge crown and chipping on the periphery of the substrate.

A preferred embodiment of the invention includes a group III nitride semiconductor substrate having beveled portion on the arc part thereof on both the group III polarity face and the nitric polarity face of said substrate, wherein said beveled portion on said nitric polarity face side is extended to cover the entire periphery of said substrate including the orientation flat with the beveling angle ranging from over 30° to 60° inclusive.

In another preferred embodiment of the invention, said group III polarity face may be orthogonal to said orientation flat face at least for a part thereof.

In another preferred embodiment of the invention, the transition portion between the side face of the arc part and said orientation flat in said substrate may be connected smoothly without any angular irregularity.

Further, in another preferred embodiment of the invention, the bevel on said group III polarity face and the bevel on said nitric polarity face may be connected with a smooth curved transition surface on said side face of the arc part in said substrate.

Moreover, in another preferred embodiment of the invention, said orientation flat face and said bevel on said nitric polarity face may be connected, at least in part, with a smooth curved transition surface.

In another preferred embodiment of the invention, said substrate may be comprised of any one of material selected from the group consisting of GaN, AlN, and InN.

According to a preferred embodiment of the present invention, an enlarged bevel angle on the nitric polarity face permits a narrower bevel width with an improved even-distribution of the temperature on the substrate face in the epitaxial growth processing. Because, narrowing the bevel width of a substrate leads to enlarging the contact area of the substrate with the susceptor. Further to the above, since the entire periphery of the nitric polarity face including the orientation flat portion is given a large beveling angle, it is easy to pick up the substrate with a tweezers at any part thereof; viz. an eased handleability is offered.

According to a preferred embodiment of the present invention, the group III polarity face is orthogonal to the orientation flat face at least for a part of the orientation flat, and, on the nitric polarity face on the other hand, the orientation flat is given beveling throughout its entire part. This substrate offers an eased discrimination of two sides of the substrate by examining the beveling state thereof; and accordingly neither index flat nor notching is required.

According to a preferred embodiment of the present invention, a smooth transition shape is provided at the shape-transition portion of the substrate so that any angular or peaked portion resulted from providing the orientation flat or giving the beveling may not be left on the side face of the substrate. This offers prevention of damage on the susceptor while the epitaxial growth is on progress and further offers a reduced possibility of occurrence of chipping at the periphery of the substrate.

DESCRIPTION OF THE PREFERRED EMBODIMENTS

Hereunder, preferred embodiments of a group III nitride semiconductor substrate according to the present invention will be described referring to figures.

A group III nitride semiconductor typically such as GaN appears usually, as its stable phase, in the wurtzite structure. However, the wurtzite structure does not have the two-fold symmetry in terms of the C-face. Therefore, where the termination of one end of a unit cell is a group III atom, the termination of the other end must be nitrogen atom. A face of which termination is a group III atom is usually referred to as a group III polarity face (+C-face) and a face of which termination is nitrogen atom is usually called a nitric polarity face (−C-face). The group III polarity face is thermochemically stable but the nitric polarity face is not. Therefore, it is a common practice to process on the group III polarity face when an epitaxial growth is intended to be implemented on a group III nitride semiconductor substrate; this means that the group III polarity face is the so-called front face of the substrate and the nitric polarity face so-called back face.

Figure 1A:
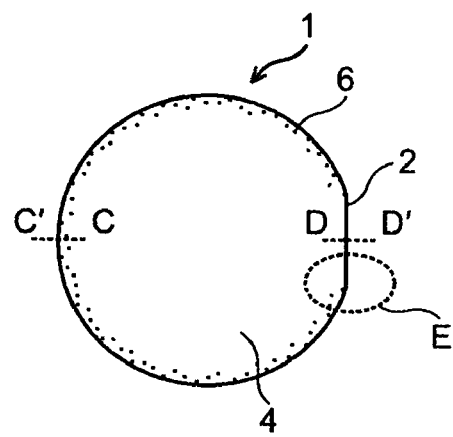
FIG. 1A is a plan view of a group III nitride semiconductor substrate according to a first embodiment and example 1 of the present invention, viewed from the group III polarity face side.
Figure 1B:
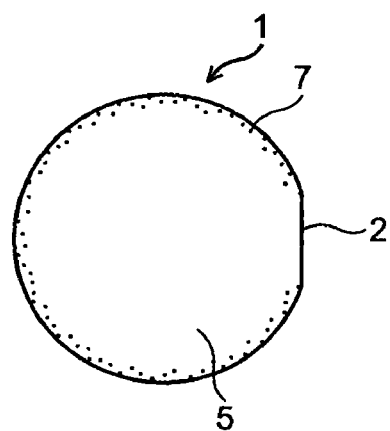
FIG. 1B is a plan view of a group III nitride semiconductor substrate according to a first embodiment and example 1 of the present invention, viewed from the nitric polarity face side.

FIG. 1A is a plan view of the GaN substrate 1 according to the first embodiment of the present invention, viewed from a group III (gallium) polarity face 4 side; and FIG. 1B is a plan view of the GaN substrate 1 according to the first embodiment of the present invention, viewed from a nitric polarity face 5 side.

The group III (gallium) polarity face 4 is the (0001) plane and the nitric polarity face 5 is the (000-1) plane.

The GaN substrate 1 is a freestanding substrate, periphery of which an orientation flat (OF) portion 2 is provided to indicate the crystal orientation. Periphery of the group III polarity face 4 side of the GaN substrate 1 is given a beveling as a bevel 6 (refer to FIG. 1A). The bevel 6 on the group III polarity face 4 side is provided on the arc portion of the GaN substrate 1 and is not provided on the OF portion 2. Periphery of the nitric polarity face 5 side of the GaN substrate 1 is also given a beveling as a bevel 7 (refer to FIG. 1B). The bevel 7 on the nitric polarity face 5 side is provided throughout the entire periphery of the GaN substrate 1 including the OF portion 2.

Figure 2:
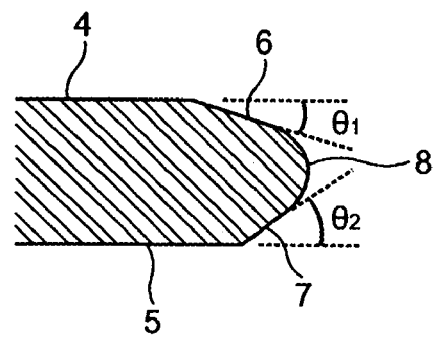
FIG. 2 is an enlarged sectional view taken along the line C-C' in FIG. 1A.

The beveling angle $\theta_1$ of the bevel 6 on the group III polarity face 4 side is given a value in the range from 5° inclusive to 30° inclusive as illustrated in FIG. 2, an enlarged sectional view of the substrate viewed on the sectioning-line C-C' in FIG. 1A. The beveling angle $\theta_2$ of the bevel 7 on the group III polarity face 5 side is given a value in the range from over 30° to 60° inclusive.

The reason that the beveling angle $\theta_1$ of the bevel 6 on the group III polarity face 4 side is given a value in the range from 5° inclusive to 30° inclusive is to prevent occurrence of the edge crown during the epitaxial growth processing on the group III polarity face 4 of the GaN substrate 1 by a MOVPE method, etc.

The reason that the beveling angle $\theta_2$ of the bevel 7 on the group III polarity face 5 side is given a value in the range over 30° to 60° inclusive is to ensure that the contact area of the nitric polarity face 5 with the susceptor is kept larger as much as possible during the epitaxial growth processing maintaining the handleability in picking up the GaN substrate 1 with a tweezers.

Figure 3:
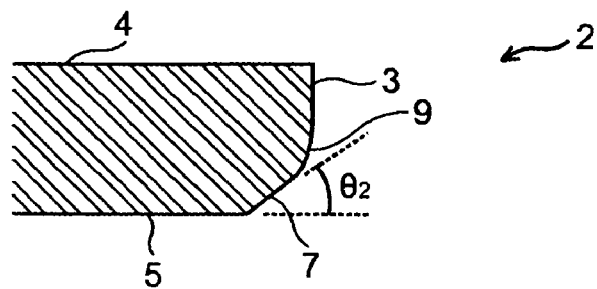
FIG. 3 is an enlarged sectional view taken along the line D-D' in FIG. 1A.

On the side face of the arc portion of the GaN substrate 1, the transition portion between the bevel 6 on the group III polarity face 4 side and the bevel 7 on the nitric polarity face 5 side is polished to form a smooth connection with a curved transition surface 8 as FIG. 2 illustrates. On the side face of the OF portion 2 of the GaN substrate 1, the transition portion between the bevel 7 on the nitric polarity face 5 side and an OF face 3 on the OF portion 2 is polished to form a smooth connection with a curved transition surface 9 as shown in FIG. 3, which is an enlarged sectional view of the substrate taken along the line D-D' in FIG. 1A.

Thus, angular irregularities at the transitions caused from beveling are connected with smooth curved transition surfaces 8 and 9. Therefore, possible chipping of the substrate 1 in the substrate handling is prevented eliminating damage on the susceptor during the epitaxial growth processing.

Figure 4:
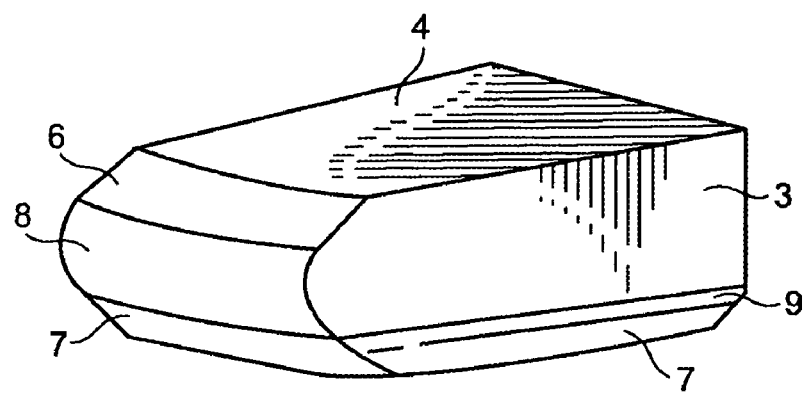
FIG. 4 is an enlarged perspective view of the part E in FIG. 1A.

FIG. 4 is an enlarged perspective view of the part E in FIG. 1A, which part is an area of the boundary and its vicinity between the arc portion of the substrate 1 and the OF portion 2. As FIG. 4 illustrates, bevels are accompanied by the curved transition surfaces 8 and 9. This transition style reduces angular rectilinear portions and edges on the boundary between the side face of the arc portion of the GaN substrate 1 and the OF portion 2 with increased smoothness in the transition.

Additionally to the above, it also is preferable to apply additional polishing or beveling to these boundary or transition portions to clean residual angular rectilinear portions and edges therein to obtain a transition with more smoothly connected.

The following describes the second embodiment of the present invention.

Figure 5A:
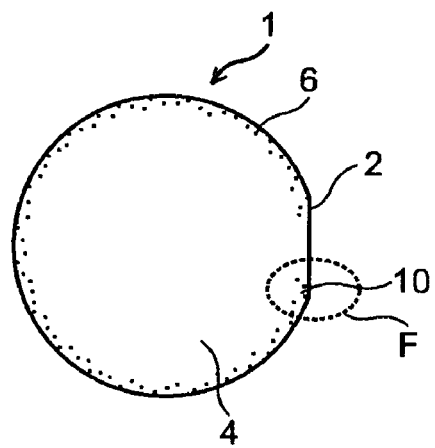
FIG. 5A is a plan view of a group III nitride semiconductor substrate according to the second embodiment and example 2 of the present invention, viewed from the group III polarity face side.
Figure 5B:
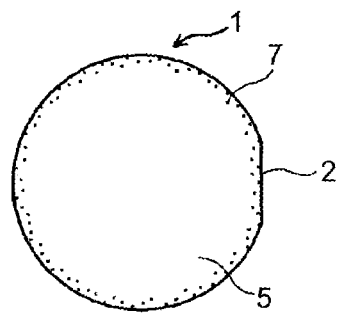
FIG. 5B is a plan view of a group III nitride semiconductor substrate according to the second embodiment and example 2 of the present invention, viewed from the nitric polarity face side.
Figure 6:
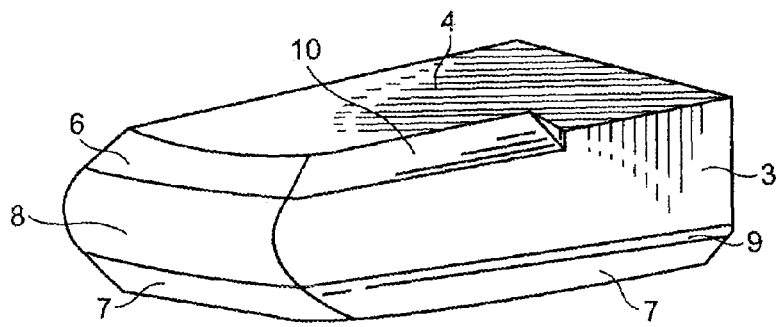
FIG. 6 is an enlarged perspective view of the part F in FIG. 5A.
Figure 7A:
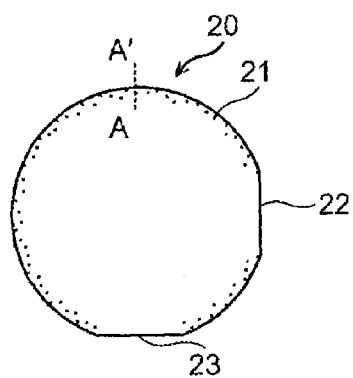
FIG. 7A is a plan view of a conventional group III nitride semiconductor substrate, viewed from the group III polarity face side.
Figure 7B:
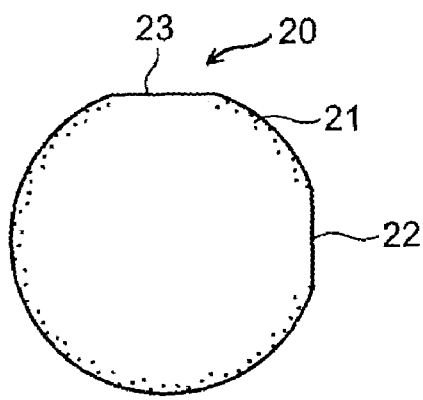
FIG. 7B is a plan view of a conventional group III nitride semiconductor substrate, viewed from the nitric polarity face side.
Figure 7C:
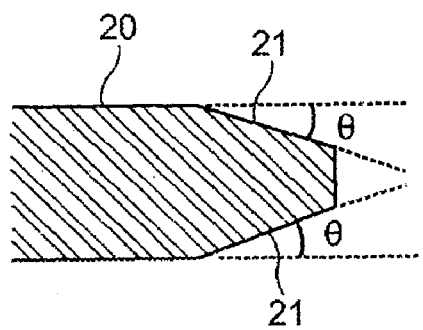
FIG. 7C is an enlarged sectional view taken along the line A-A' in FIG. 7A for the case C-beveling is applied.
Figure 7D:
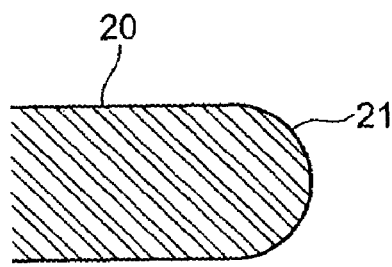
FIG. 7D is an enlarged sectional view taken along the line A-A' in FIG. 7A for the case R-beveling is applied

The GaN substrate 1 according to the second embodiment is a substrate that is given an additional beveling to the GaN substrate 1 defined in the first embodiment as shown in FIGS. 5A, 5B and 6. FIG. 5A is a plan view of the GaN substrate 1 viewed from the group III (gallium) polarity 4 side; FIG. 5B is a plan view of the GaN substrate 1 viewed from the nitric polarity 5 side; and FIG. 6 is an enlarged perspective view of the part F in FIG. 5A.

In the GaN substrate 1 according to the first embodiment, no part of the OF portion 2 on the group III polarity face 4 side is beveled; but in the GaN substrate 1 according to the second embodiment, a part of the OF portion 2 is left un-beveled. That is; the GaN substrate 1 according to the second embodiment is a substrate that is given beveling as a bevel 10 to the GaN substrate 1 defined in the first embodiment at the both ends of the OF portion 2 thereof, where the group III polarity face 4 is orthogonal to the OF face 3.

The reason that the bevel 10 is additionally provided is to reduce, as much as possible, such a non-beveled area as invites occurrence of edge crown while epitaxial growth on the GaN substrate 1 is on progress.

In the embodiments stated above, the group III polarity face 4 is orthogonal to the OF face 3 throughout the entire OF portion 2 or a part thereof. Therefore, when a device is intended to be built on the GaN substrate 1, the observation under a microscope can detect the OF portion that indicates a designated crystal orientation with a great accuracy permitting a precise angle-alignment using an optical manner. Further, the substrate 1 according to the embodiment stated above has such a portion as is not given beveling on the OF portion 2 of the group III polarity face 4 in contrast to the nitric polarity face 5 that is given beveling throughout the entire periphery thereof. This feature, not-beveled and beveled portions on one substrate severally on the face, provides an easy distinction of two sides of a substrate requiring no provision of the IF portion thereon.

This feature however tends to cause the substrate to suffer from chipping. Because, such substrate is not given beveling for a part of or the entirety of the OF portion 2 on the group III polarity face 4 side thereof, which part therefore may invite chipping. For example, where the OF face 3 is the (11-20) plane or an equivalent plane thereto, the (10-10) plane including an equivalent plane thereto, which is orthogonal to the OF face 3, is the face easiest to cleave in crystals belonging to the group III nitride crystals like GaN that appear in the wurtzite structure. Therefore, if a chipping occurs at the OF portion 2 of a substrate, the chipping easily triggers break of the substrate. This means that the OF face 3 is preferred to be the (10-10) plane or an equivalent plane.

In the embodiment stated above, the GaN substrate 1 of freestanding type is manufactured by a HVPE (Hydride Vapor Phase Epitaxy) method, a MOC (Metal Organic Chloride) method, a MOVPE (Metal Organic Chemical Vapor Deposition) method, or another equivalent method.

Additionally, the present invention is applicable also to AlN substrates or InN substrates, or both, although the embodiment stated above is described using a GaN substrate as a typical example of the group III nitride semiconductor substrate.

Hereunder, embodiments of the present invention will be described concretely.

EXAMPLE 1

At the start, a single crystalline substrate of GaN was prepared. The method of this preparation was the void-assisted separation method (Yuichi OSHIMA et al. Japanese Journal of Applied Physics, Vol. 42 (2003), pp. L1-L3), through which method a GaN crystal was grown to a thickness of 600 μm on a sapphire substrate having a diameter of 62.5 mm, then the GaN crystal was separated from the sapphire substrate. To the GaN crystal of a freestanding type thus prepared, a mirror polishing was applied in the order of the group III polarity face then the nitric polarity face to obtain a both-face polished GaN substrate having a thickness of 400 μm. Further, the contour of this both-face polished GaN substrate was given a shaping grinding to a round shape of 2-inch diameter.

Following to these processes, the GaN substrate 1 of 2-inch diameter thus obtained was given a C-beveling by a grinding on the periphery of the nitric polarity face 5 side thereof as illustrated in FIGS. 1 to 4. The beveling angle $\theta_2$ at the bevel 7 in this C-beveling was designed 45°. Then, the periphery of the group III polarity face 4 side of the GaN substrate 1 was given a C-beveling by a grinding. The beveling angle $\theta_1$ at the bevel 6 in this C-beveling was designed 18°. The substrate was further given a beveling to form a curved transition surface 8 by a grinding so that the transition between the bevel 6 on the group III polarity face 4 side and the bevel 7 on the nitric polarity face 5 side may form a smooth connection throughout the entire periphery of the GaN substrate 1.

On completion of beveling, an X-ray diffraction examination was conducted over the GaN substrate 1 distinguishing the <10-10> orientation thereby; then the (10-10) plane was ground out to bring the (10-10) plane into the OF face 3. In this treatment, the length of an OF (the length of the nodal line on which (0001) plane intersects orthogonally with the (10-10) plane) was designed to be 17 mm. Then, the nitric polarity face 5 side of the OF portion 2 was given a C-beveling with a beveling angle of $\theta_2=45°$ and further beveling was given thereto to form a curved transition surface 9 so that the transition between the C-beveled bevel 7 and the OF face 3 may form a smooth connection. Thus, the GaN substrate 1 illustrated in FIGS. 1 to 4 was obtained.

EXAMPLE 2

On the GaN substrate 1 obtained through the treatment described in the example 1, a bevel 10 having a length of 5 mm was provided at both ends of the OF portion 2 on the group III polarity face 4 side leaving 7 mm of the un-beveled portion in the OF-length. Thus, the GaN substrate 1 as illustrated in FIGS. 5 and 6 was obtained.

The leaving of 7 mm of un-beveled portion in the OF portion 2 in the example 2 come from the reason that the beveled portion should be maximized; because non-beveled portion will invite the edge crown on completion of the epitaxial growth processing. On the other hand, in manufacturing a device like a laser diode, it is difficult to perform a precise alignment of the crystal orientation as desired unless a minimum of 7 mm of a reference length is retained in the OF portion.

What is claimed is:

1. A group III nitride semiconductor substrate having beveled portions on both a group III polarity face and a nitric polarity face at the periphery of an arc part of said substrate, and an orientation flat portion, wherein the entire periphery of the orientation flat portion of the nitric polarity face is beveled, the orientation flat portion of said group III polarity face has at least one part which is not beveled, and said group III polarity face is orthogonal to said orientation flat face at said at least one part.

2. The group III nitride semiconductor substrate according to claim 1, wherein a transition portion between the side face of the arc part and said orientation flat portion in said substrate is connected smoothly without any angular irregularity.

3. The group III nitride semiconductor substrate according to claim 1, wherein said substrate is comprised of any one of material selected from a group consisting of GaN, AlN and InN.

* * * * *